US012796451B2

(12) United States Patent
Hsiao et al.

(10) Patent No.: US 12,796,451 B2
(45) Date of Patent: Nov. 10, 2026

(54) BILAYER RDL STRUCTURE FOR BUMP COUNT REDUCTION

(71) Applicant: Taiwan Semiconductor Manufacturing Company, Ltd., Hsinchu (TW)

(72) Inventors: Tsung-Chieh Hsiao, Shetou Township, Changhua County (TW); Liang-Wei Wang, Hsinchu City (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 948 days.

(21) Appl. No.: 17/829,790

(22) Filed: Jun. 1, 2022

(65) Prior Publication Data

US 2023/0395486 A1 Dec. 7, 2023

(51) Int. Cl.
*H10W 20/40* (2026.01)
*H10W 20/00* (2026.01)
(Continued)

(52) U.S. Cl.
CPC ....... *H10W 20/496* (2026.01); *H10W 20/089* (2026.01); *H10W 20/42* (2026.01); (Continued)

(58) Field of Classification Search
CPC ........... H01L 23/5223; H01L 21/76816; H01L 23/5226; H01L 23/5283; H01L 23/53219; H01L 23/53233; H01L 24/06; H01L 24/14; H01L 21/76843; H01L 23/5286; H01L 2224/02311; H01L 2224/02313; H01L 2224/02331; H01L 2224/02373; H01L 2224/02381; H01L 2224/0239; H01L 2224/06151; H01L 2224/06159; H01L 2224/14104; H01L 2224/14151; (Continued)

(56) References Cited

U.S. PATENT DOCUMENTS

2001/0013647 A1* 8/2001 Hsu .................... H01L 23/4985 257/738
2009/0140381 A1* 6/2009 Lin ...................... H01L 23/481 257/528
2012/0175779 A1* 7/2012 Lin ..................... H01L 23/3128 257/773

* cited by examiner

*Primary Examiner* — John P. Dulka
(74) *Attorney, Agent, or Firm* — McClure, Qualey & Rodack, LLP

(57) ABSTRACT

A method of forming semiconductor device includes forming interconnect structure over substrate; forming first passivation layer over the interconnect structure, and metal-insulator-metal capacitor in the first passivation layer; forming first redistribution layer including first pads over the first passivation layer, and first vias extending into the first passivation layer; conformally forming second passivation layer over the first redistribution layer and first passivation layer, and patterning the second passivation layer to form via openings exposing the first pads; forming second redistribution layer including second pads over the second passivation layer, and second vias in the first via openings, wherein the first and second redistribution layers include aluminum-copper alloy and copper, respectively; forming dielectric layer over the second redistribution layer, and patterning the dielectric layer to form via openings exposing some second pads; and forming bumps over the dielectric layer and in the via openings to contact exposed second pads.

20 Claims, 17 Drawing Sheets

(51) Int. Cl.

| | |
|---|---|
| ***H10W 20/41*** | (2026.01) |
| ***H10W 20/42*** | (2026.01) |
| ***H10W 20/44*** | (2026.01) |
| ***H10W 70/05*** | (2026.01) |
| ***H10W 70/60*** | (2026.01) |
| ***H10W 70/65*** | (2026.01) |
| ***H10W 70/652*** | (2026.01) |
| ***H10W 70/66*** | (2026.01) |
| ***H10W 72/20*** | (2026.01) |
| ***H10W 72/90*** | (2026.01) |

(52) U.S. Cl.
CPC ..... *H10W 20/435* (2026.01); *H10W 20/4407* (2026.01); *H10W 20/4424* (2026.01); *H10W 20/033* (2026.01); *H10W 20/427* (2026.01); *H10W 70/05* (2026.01); *H10W 70/60* (2026.01); *H10W 70/65* (2026.01); *H10W 70/652* (2026.01); *H10W 70/66* (2026.01); *H10W 72/244* (2026.01); *H10W 72/247* (2026.01); *H10W 72/248* (2026.01); *H10W 72/9445* (2026.01)

(58) Field of Classification Search
CPC ......... H01L 2924/381; H01L 2924/384; H01L 2224/0401; H01L 2224/05008; H01L 2224/05009; H01L 2224/05014; H01L 2224/05027; H01L 2224/05073; H01L 2224/05554; H01L 2224/05563; H01L 2224/05572; H01L 2224/05573; H01L 2224/06133; H01L 2224/06138; H01L 2224/06515; H01L 24/05; H10W 20/496; H10W 20/089; H10W 20/42; H10W 20/435; H10W 20/4407; H10W 20/4424; H10W 20/033; H10W 20/427; H10W 70/05; H10W 70/60; H10W 70/65; H10W 70/652; H10W 70/66; H10W 72/244; H10W 72/247; H10W 72/248; H10W 72/9445; H10W 72/29; H10W 72/90; H10W 72/9223; H10W 72/9226; H10W 72/923; H10W 72/932; H10W 72/9415; H10W 72/942; H10W 72/967
See application file for complete search history.

BILAYER RDL STRUCTURE FOR BUMP COUNT REDUCTION

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the 5 nm node). As semiconductor devices are scaled down, new techniques are needed to maintain the electronic components' performance from one generation to the next. Device complexity is increasing as manufacturers design smaller feature sizes and more functionality into integrated circuits.

One type of capacitor is a metal-insulator-metal (MIM) capacitor, which is used in mixed signal devices and logic devices, such as embedded memories and radio frequency devices. MIM capacitors are used to store a charge in a variety of semiconductor devices. A MIM capacitor is formed horizontally over a semiconductor substrate, with two metal layers sandwiching a dielectric layer parallel to the semiconductor substrate.

Although existing processes for fabricating semiconductor devices with MIM capacitors have generally been adequate for their intended purposes, they have not been entirely satisfactory in all respects. For example, it is desirable to form a semiconductor device that includes as few conductive bumps as possible to reduce device size.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
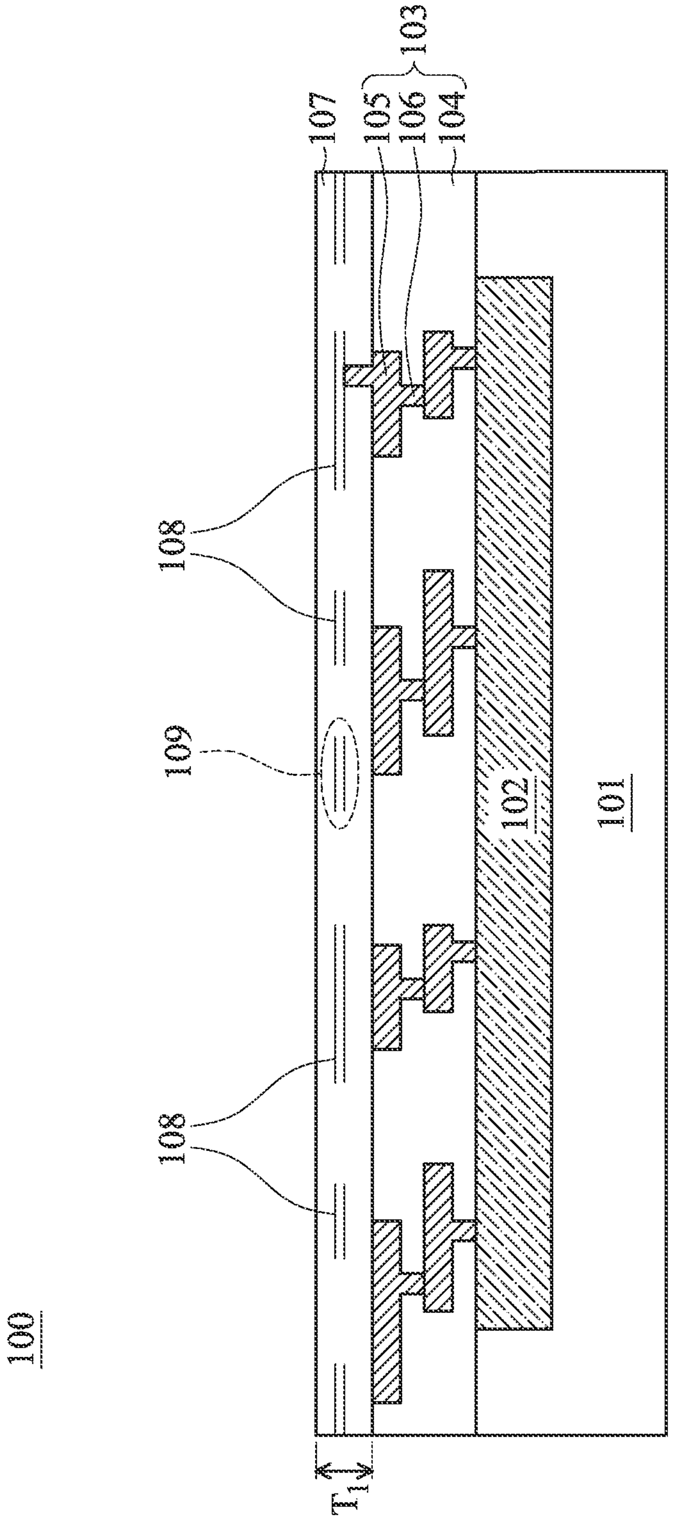
FIGS. 1A, 1B, 2, 3A, 3B, 4-7, 8A, 8B, 9, 10A, and 10B illustrate cross-sectional views or plan views of intermediate stages in the formation of a semiconductor device including metal-insulator-metal (MIM) capacitors in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Throughout the description herein, unless otherwise specified, the same or similar reference numerals in different figures refer to the same or similar element formed by a same or similar formation method sing a same or similar material(s). In addition, unless otherwise specified, figures with the same numeral and different alphabets (e.g., FIG. 8A and FIG. 8B) illustrate different views (e.g., along different cross-sections) of the same semiconductor device at the same stage of manufacturing.

The present disclosure relates to a semiconductor device including metal-insulator-metal (MIM) capacitors and a method of forming the same. In accordance with some embodiments, a bilayer redistribution layer (RDL) structure is formed over a passivation layer embedding MIM capacitors. The bilayer RDL structure includes a first RDL layer and a second RDL layer over the first RDL layer. The first RDL layer and its associated redistribution vias are configured to electrically couple underlying devices or components (e.g., the MIM capacitors and underlying circuits and/or electrical components/devices) and to electrically couple those underlying devices or components to the second RDL layer above. The second RDL layer and its associated redistribution vias are configured to provide routing of power and ground signals to devices or components in the semiconductor device. Conductive bumps formed on the second RDL layer provide the power and ground signals and provide electrical connection between the semiconductor device and an external circuitry. In accordance with some embodiments, the second RDL layer is formed of a material with a lower surface/sheet resistance than the first RDL layer. Therefore, it is more suitable (compared to the first RDL layer) for routing of the power and grounds due to lower IR drop and can help reduce the number of power and ground bumps. As a result, the bump area (and thus the device area) of the semiconductor device can also be reduced accordingly, contributing to device size reduction in advanced technology applications. Also, the redistribution vias associated with the first RDL layer have a smaller via pitch than the redistribution vias associated with the second RDL layer, which facilitates better RC delay performance when the MIM capacitors operate at high frequencies.

FIGS. 1A, 1B, 2, 3A, 3B, 4-7, 8A, 8B, 9, 10A, and 10B illustrate cross-sectional views or plan views of a semiconductor device 100 at various stages of manufacturing, in accordance with some embodiments. Some corresponding processes are also reflected schematically in the process flow shown in FIG. 13. The semiconductor device 100 may be a device wafer including active devices (e.g., transistors, diodes, or the like) and/or passive devices (e.g., capacitors, inductors, resistors, or the like), and may include multiple semiconductor chips (which are also referred to as semiconductor dies when sawed apart). For simplicity, only one die is depicted in the figures. These dies may include logic dies (e.g., central processing unit (CPU) die, graphics processing unit (GPU) die, field-programmable gate array (FPGA) die, application specific integrated circuit (ASIC) die, system-on-chip (SoC) die, system-on-integrated-chip (SoIC) die, microcontroller die, or the like), memory dies (e.g., dynamic random access memory (DRAM) die, static random access memory (SRAM) die, high bandwidth memory (HBM) die, or the like), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) die), the like, or combinations thereof.

In some embodiments, the semiconductor device 100 is an interposer wafer, which may or may not include active devices and/or passive devices. In subsequent discussion, a device wafer is used as an example of the semiconductor device 100. The teaching of the present disclosure may also be applied to interposer wafers or other semiconductor structures, as those skilled in the art will readily appreciate.

As shown in FIG. 1A, the semiconductor device 100 includes a semiconductor substrate 101 and electrical components 102 (e.g., transistors, diodes, resistors, inductors, or the like) formed in or on the semiconductor substrate 101 (which may also be referred to as substrate). The semiconductor substrate 101 may include a semiconductor material, such as silicon, doped or undoped, or an active layer of a semiconductor-on-insulator (SOI) substrate. The semiconductor substrate 101 may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, GaInAsP, or a combination thereof. Other substrates, such as multi-layered or gradient substrates, may also be used.

In FIG. 1A, electrical components 102 are formed in device regions of the semiconductor substrate 101. Examples of the electrical components 102 include transistors (e.g., complementary metal-oxide semiconductor (CMOS) transistors), diodes, resistors, capacitors, inductors, and the like. The electrical components 102 may be formed using any suitable method, and the details are not discussed here.

In some embodiments, after the electrical components 102 are formed, an inter-layer dielectric (ILD) layer (not shown for simplicity) is formed over the semiconductor substrate 101 and over the electrical components 102. The ILD layer may fill gaps between gate stacks of the transistors (not shown) of the electrical components 102. In accordance with some embodiments, the ILD layer comprises silicon oxide, phosphosilicate glass (PSG), borosilicate glass (BSG), boron-doped phosphosilicate glass (BPSG), fluorine-doped silicate glass (FSG), or the like. The ILD layer may be formed using spin coating, flowable chemical vapor deposition (FCVD), plasma enhanced chemical vapor deposition (PECVD), low pressure chemical vapor deposition (LPCVD), another applicable process, or a combination thereof.

Contact plugs are formed in the ILD layer to electrically couple the electrical components 102 to conductive features (e.g., metal lines and vias) of subsequently formed interconnect structure 103. Note that in the present disclosure, unless otherwise specified, a conductive feature refers to an electrically conductive feature, and a conductive material refers to an electrically conductive material. In accordance with some embodiments, the contact plugs comprise a conductive material such as tungsten, aluminum, copper, titanium, tantalum, titanium nitride, tantalum nitride, alloys thereof, and/or multi-layers thereof. The formation of the contact plugs may include forming contact openings in the ILD layer; forming one or more conductive material(s) in the contact openings; and performing a planarization process, such as chemical mechanical polish (CMP), to level the top surface of the contact plugs with the top surface of the ILD layer.

Figure 13:
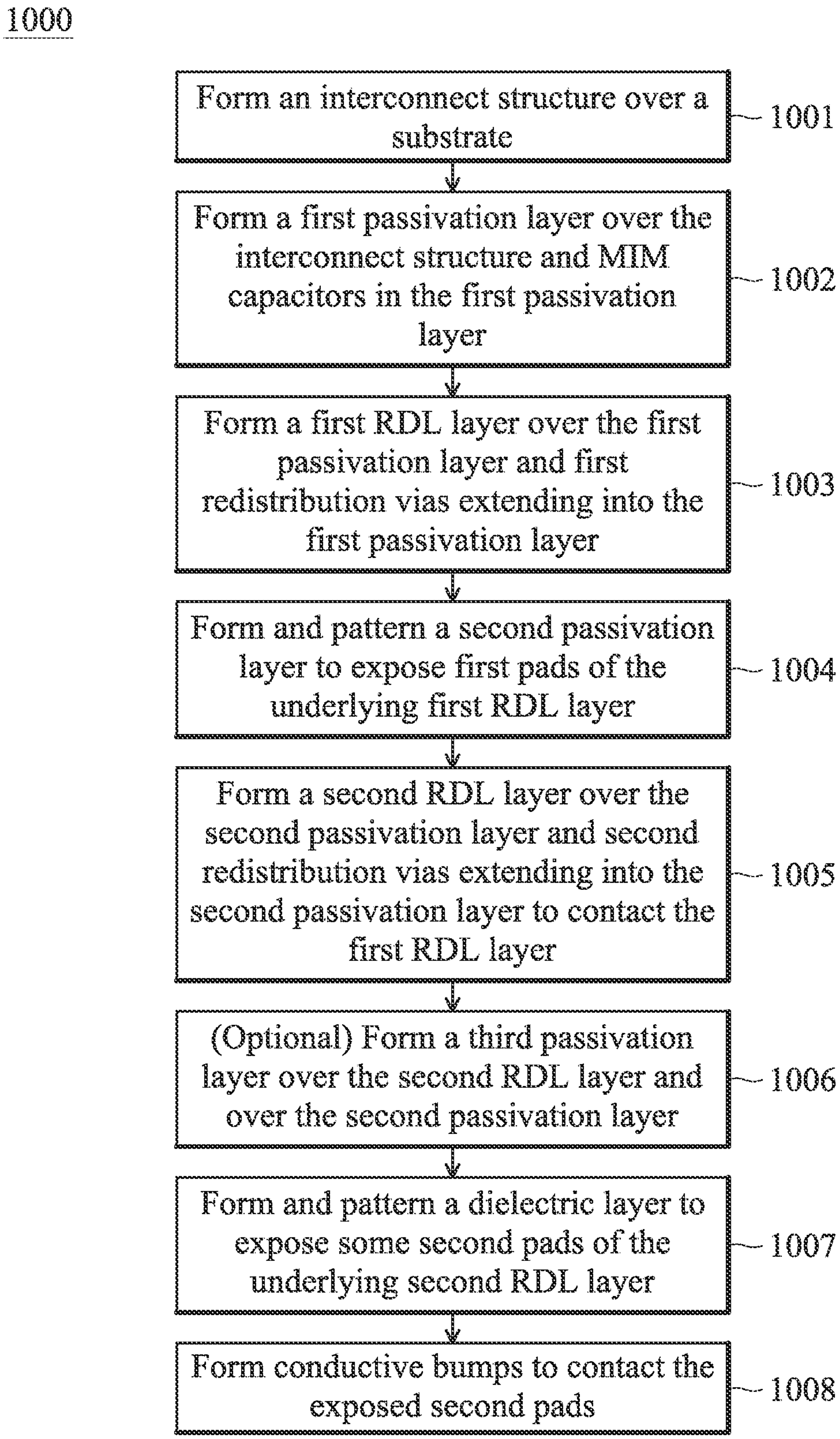
FIG. 13 is a simplified flowchart illustrating a method for fabricating a semiconductor device with MIM capacitors in accordance with some embodiments.

Still referring to FIG. 1A, an interconnect structure 103 is formed over the ILD layer, over the semiconductor substrate 101, and over the electrical components 102. The respective process is illustrated as process 1001 in the process flow 1000 as shown in FIG. 13. The interconnect structure 103 comprises dielectric layers 104 and conductive features (e.g., metal lines and vias) formed in the dielectric layers 104. The interconnect structure 103 is used to interconnect (e.g., being electrically coupled to) the electrical components 102 to form functional circuits of the semiconductor device 100.

In some embodiments, each of the dielectric layers 104, which may also be referred to as an inter-metal dielectric (IMD) layer, comprises a dielectric material such as silicon oxide, silicon nitride, silicon carbide, silicon oxynitride, or the like. In accordance with some embodiments, the dielectric layers 104 are formed of a low-k dielectric material having a dielectric constant (k-value) lower than 3.0, such as about 2.5, about 2.0, or even lower. The formation of each of the dielectric layers 104 may include depositing a porogen-containing dielectric material over the ILD layer, and then performing a curing process to drive out the porogen, thereby forming the dielectric layer 104 that is porous. Other suitable method may also be used to form the dielectric layers 104.

As shown in FIG. 1A, conductive features, such as conductive lines 105 and conductive vias 106, are formed in the dielectric layers 104. In some embodiments, the conductive features include a diffusion barrier layer and a conductive material (e.g., copper, or a copper-containing material) over the diffusion barrier layer. The diffusion barrier layer may include titanium, titanium nitride, tantalum, tantalum nitride, or the like, and may be formed by CVD, physical vapor deposition (PVD), atomic layer deposition (ALD), another applicable process or a combination thereof. After the diffusion barrier layer is formed, the conductive material is formed over the diffusion barrier layer. The formation of the conductive features may include a single damascene process, a dual damascene process, or the like.

Next, a passivation layer 107 is formed over the interconnect structure 103, and metal-insulator-metal (MIM) capacitors 108 are formed in the passivation layer 107 (which may also be referred to as first passivation layer). The respective process is illustrated as process 1002 in the process flow 1000 as shown in FIG. 13. The passivation layer 107 may include multiple sub-layers (e.g., 107A-107E shown in FIG. 1B) and may be formed of one or more suitable dielectric materials such as silicon oxide, silicon nitride, low-k dielectrics such as carbon doped oxides, extremely low-k dielectrics such as porous carbon doped silicon dioxide, another applicable material, or a combination thereof. The passivation layer 107 may be formed by CVD, FVCVD, or the like. In an example, the thickness $T_1$ of the passivation layer 107 may be in the range between about 10 kÅ (Ångstrom) to about 20 kÅ (e.g., about 10 kÅ), but the present disclosure is not limited thereto.

Figure 1B:
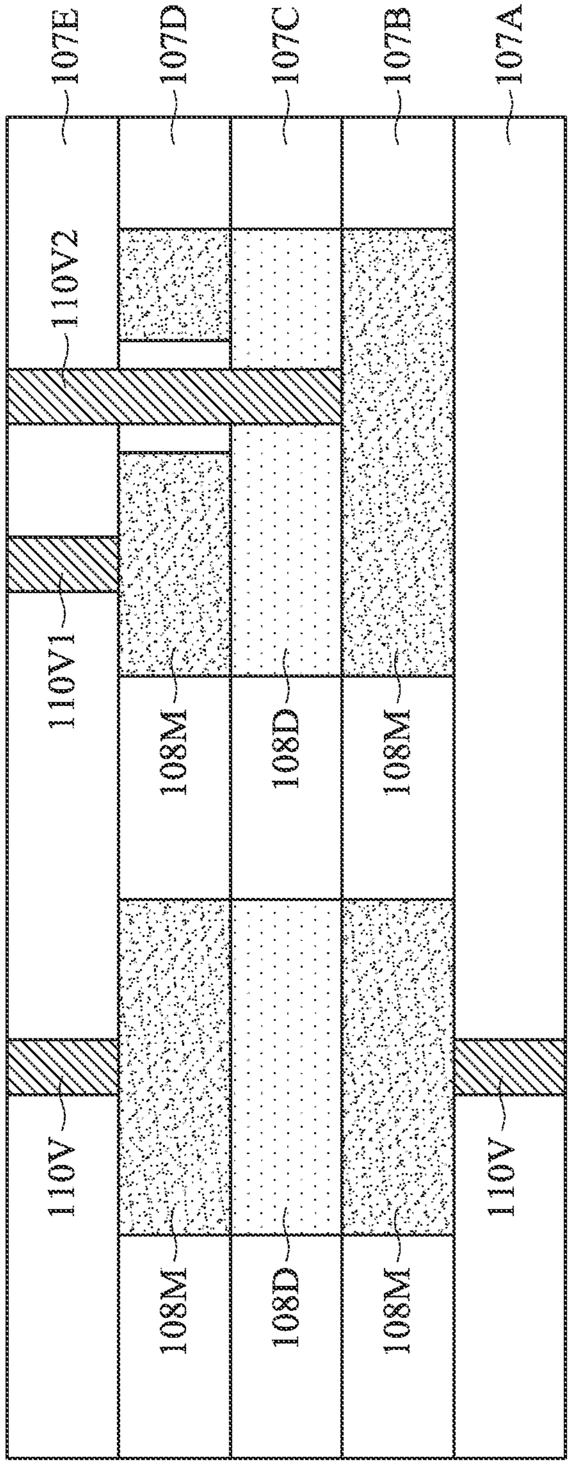

FIG. 1B illustrates an enlarged view of an area 109 in FIG. 1A to show details of the MIM capacitors 108. As shown in FIG. 1B, each of the MIM capacitors 108 includes two metal layers 108M (e.g., copper layers) and a dielectric layer 108D (e.g., a high-k dielectric layer) between the metal layers 108M. Each of the layers (e.g., 108M, 108D, and 108M) of the MIM capacitors 108 is formed in a respective passivation layer (e.g., 107B, 107C, or 107D). The upper metal layer 108M and the lower metal layer 108M of the MIM capacitor 108 may be connected to an overlying via 110V and an underlying via 110V, respectively, where the overlying via 110V and the underlying via 110V are formed in passivation layers 107E and 107A, respectively, in an example (see the left part of FIG. 1B). In another example (see the right part of FIG. 1B), the upper metal layer 108M and the lower metal layer 108M of the MIM capacitor 108 may be connected to a first overlying via 110V1 and a second overlying via 110V2, respectively. The second overlying via 110V2 extends through the passivation layer 107D and the dielectric layer 108D to connect with the lower metal layer 108M. Note that the second overlying via 110V2 is separated from (e.g., not contacting) the upper metal layer 108M of the MIM capacitor 108 by portions of the passivation layer 107D.

Referring back to FIG. 1A, the lower metal layer of the MIM capacitor 108 may be electrically coupled to a conductive feature of the interconnect structure 103, e.g., through a conductive via that extends from the lower metal layer of the MIM capacitor 108 to the conductive feature of the interconnect structure 103. In addition, the MIM capacitors 108 may be electrically coupled in parallel to provide a large capacitance value. For example, the upper metal layers of the MIM capacitors 108 may be electrically coupled together, and the lower metal layers of the MIM capacitors 108 may be electrically coupled together.

Figure 2:
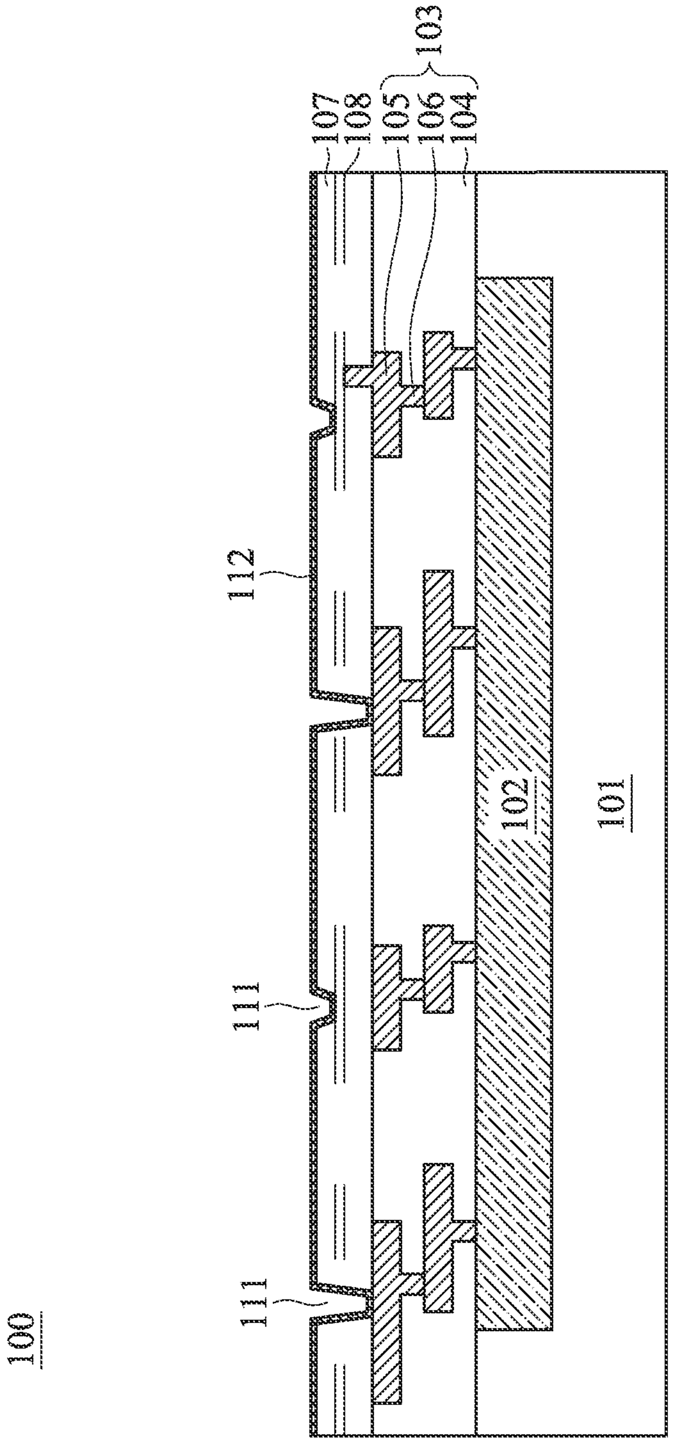

Referring next to FIG. 2, openings 111 are formed in the passivation layer 107. Some openings 111 extend through the passivation layer 107 to expose conductive features of the interconnect structure 103, while other some openings 111 extend partially through the passivation layer 107 to expose the upper metal layers of the MIM capacitors 108. The openings 111 may be formed in one or more etching processes (e.g., anisotropic etching processes), and sidewalls of each of the openings 111 may be perpendicular to or inclined to the upper surface of the passivation layer 107.

After the openings 111 are formed, a barrier layer 112 is formed conformally over the upper surface of the passivation layer 107 and along sidewalls and bottoms of the openings 111. The barrier layer 112 may have a multi-layer structure, and may include a diffusion barrier layer (e.g., a TiN layer) and a seed layer (e.g., a copper seed layer) formed over the diffusion barrier layer. The barrier layer 112 may be formed using any suitable method, such as CVD, PVD, ALD, another applicable process, or a combination thereof.

Figure 3A:
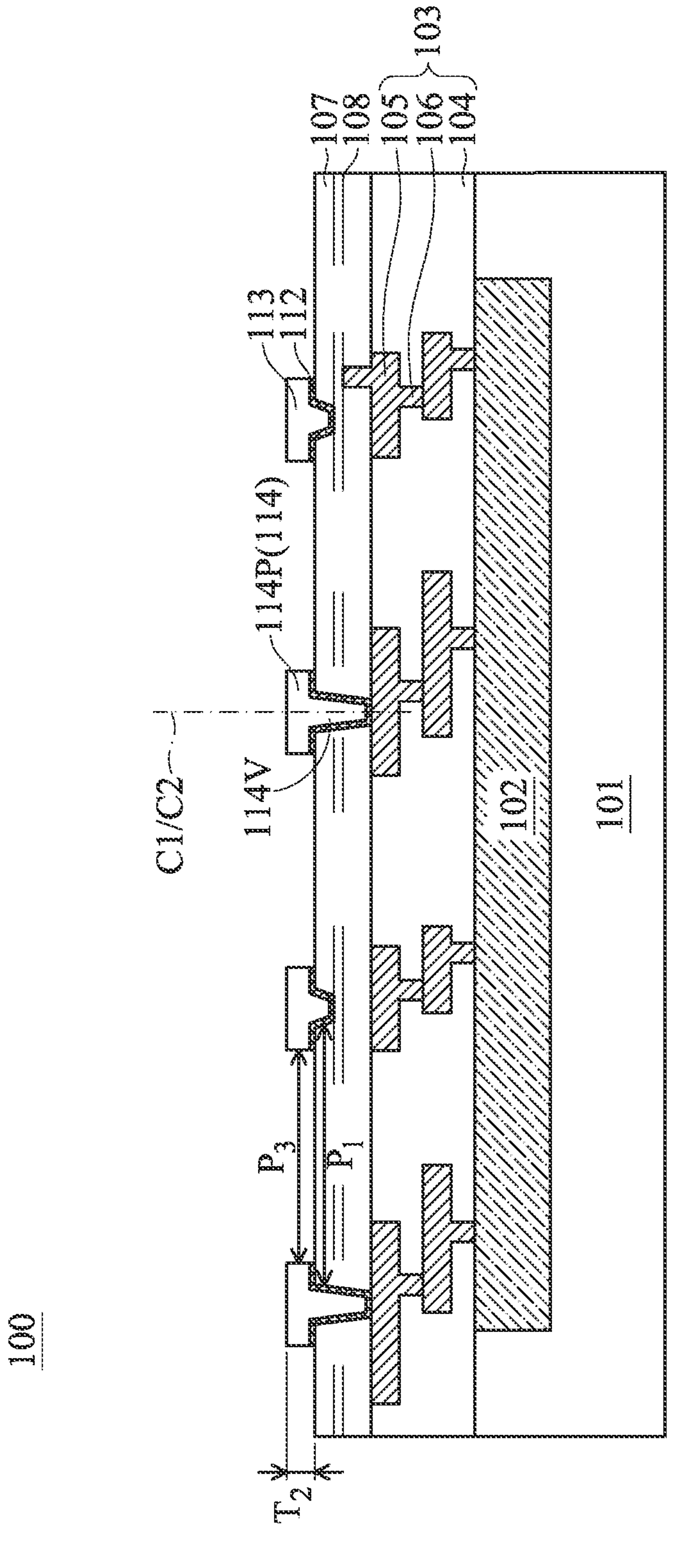

Referring next to FIG. 3A, conductive pads 114P are formed over the passivation layer 107, and conductive vias 114V are formed in the openings 111 (see FIG. 2) of the passivation layer 107. The formation of the conductive pads 114P and the conductive vias 114V may include depositing a conductive (or metal) material 113 (e.g., an aluminum-copper alloy) over the barrier layer 112 and in the openings 111 using a suitable deposition method such as PVD, sputtering, evaporation, or the like; forming a photoresist layer over the conductive material 113 using, for example, spin coating; patterning the photoresist layer (e.g., using photolithography technique) to form openings at locations where the first RDL layer 114 will not be formed; performing an etching process (e.g., anisotropic etching process) to remove portions of the conductive material 113 on which the photoresist layer is not formed (and portions of the barrier layer 112 below); and then removing the patterned photoresist layer by a suitable removal process, such as ashing.

As a result, portions of the conductive material 113 remaining over the passivation layer 107 form the conductive pads 114P, and portions of the conductive material 113 that fill (i.e., extending into) the openings 111 in the passivation layer 107 form the conductive vias 114V, where the conductive vias 114V electrically couple the conductive pads 114P to underlying conductive features of the interconnect structure 103 and/or the MIM capacitors 108. Note that in the discussion herein, the barrier layer 112 in the openings 111 is considered part of the conductive vias 114V, and the barrier layer 112 over the upper surface of the passivation layer 107 is considered part of the conductive pads 114P. Although not shown in FIG. 3A, conductive lines (e.g., aluminum-copper (Al—Cu) alloy lines) may also be formed over the upper surface of the passivation layer 107 during the same processing steps to form the conductive pads 114P. The conductive pads 114P (which may also be referred to as first pads) and the conductive lines may be collectively referred to as a redistribution layer (RDL) 114 (which may also be referred to as first RDL layer), and the conductive vias 114V may be referred to as (first) redistribution vias 114V. The respective process of forming the first RDL layer 114 and the first redistribution vias 114V is illustrated as process 1003 in the process flow 1000 as shown in FIG. 13.

In an example, the thickness $T_2$ of the first RDL layer 114 may be in the range between about 10 kÅ to about 40 kÅ (e.g., about 28 kÅ), but the present disclosure is not limited thereto. The shape of the cross-section of the conductive pad 114P may be a dome shape (e.g., with a curved upper surface), a concave shape, a polygon shape, or a rectangular (or square) shape.

Figure 3B:
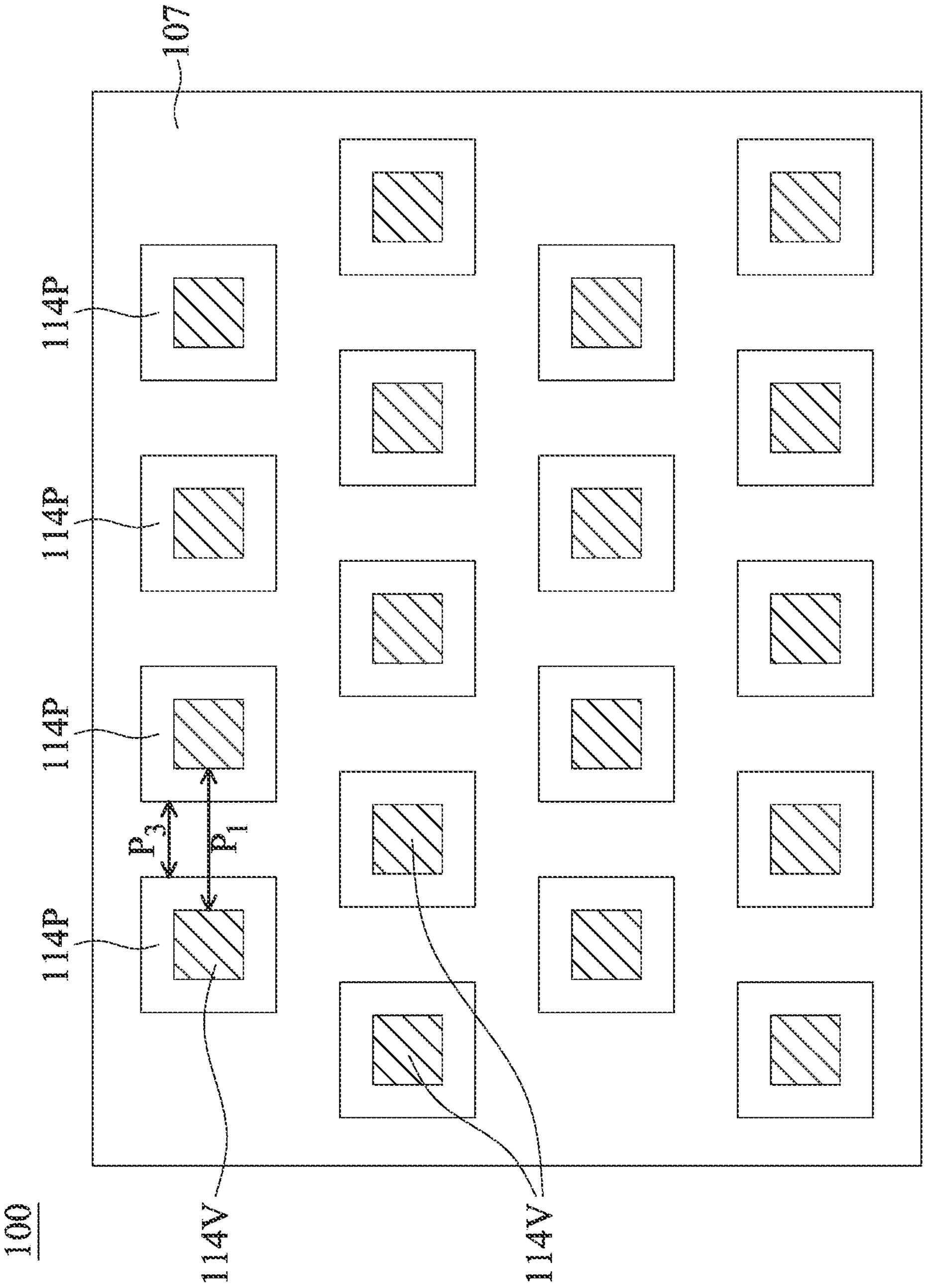

FIG. 3B is a schematic plan view showing the arrangement of the conductive pads 114P of the first RDL layer 114 and the conductive vias 114V in FIG. 3A (where conductive lines of the first RDL layer 114 interconnecting the conductive pads 114P are not shown for simplicity). The conductive pads 114P may be arranged in multiple rows and columns over the passivation layer 107, and the conductive vias 114V may be arranged corresponding to the conductive pads 114P. It should be understood that the configuration of the conductive pads 114P and the conductive vias 114V shown in FIG. 3B is merely a schematic example, and is not intended to be, and should not be constructed to be, limiting to the present disclosure. Each of the conductive pads 114P and conductive vias 114V in FIG. 3B is illustrated to have a square shape as a non-limiting example. Other shapes, such as circle shape, oval shape, rectangular shape, other polygon shape, or the like, are also possible and are fully intended to be included within the scope of the current disclosure.

In some embodiments, the center (line) C1 of each of the conductive pads 114P is aligned with the center (line) C2 of the respective conductive via 114V, as shown in FIG. 3A, but the center line C1 of the conductive pad 114P may also be laterally offset from the center line C2 of the respective conductive via 114V in other embodiments (which will be described further later).

In the example of FIGS. 3A and 3B, the (minimum) space $P_1$ between adjacent conductive vias 114V may be in the range between about 5 μm (micrometer) to 7 μm (e.g., about 5 μm), and/or the (minimum) space $P_3$ between adjacent conductive pads 114P may be in the range between about 4 μm to 6 μm (e.g., about 4 μm), but the present disclosure is not limited thereto.

Figure 4:
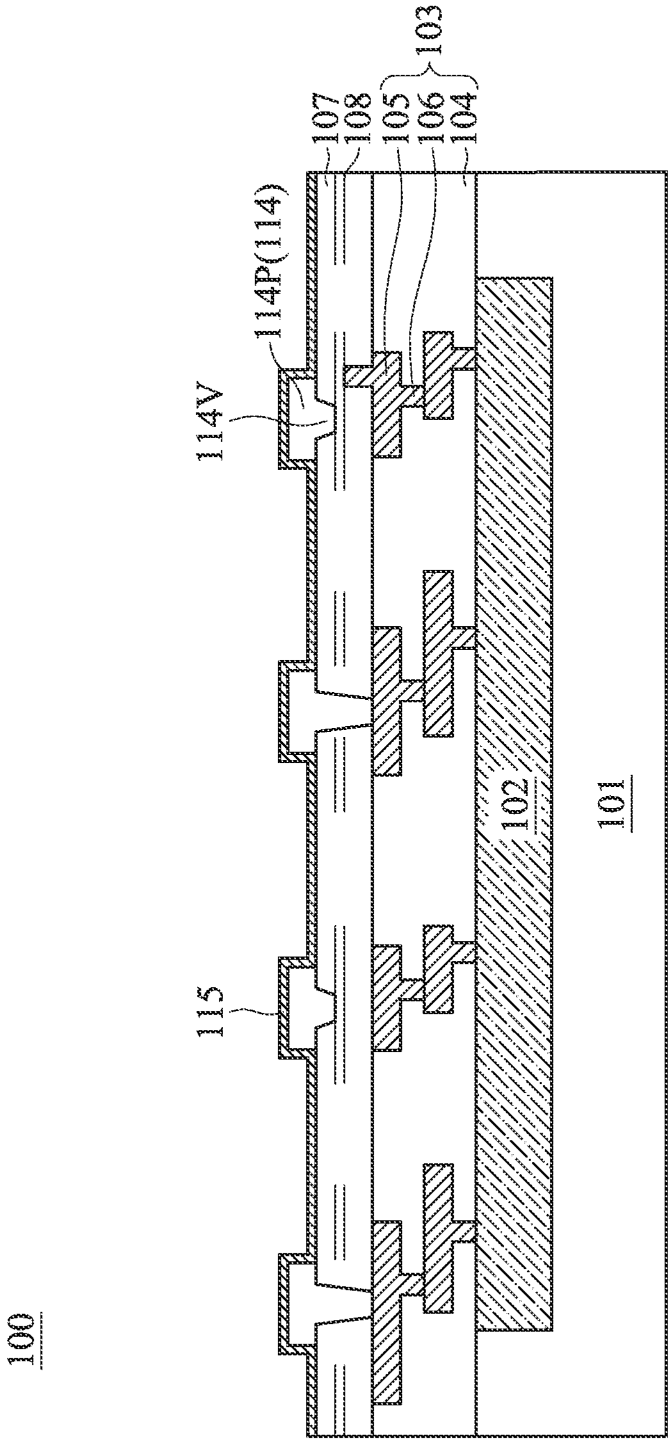

Referring next to FIG. 4, a passivation layer 115 (which may also be referred to as second passivation layer) is conformally formed over the first RDL layer 114 and the (first) passivation layer 107. In some embodiments, the passivation layer 115 has a multi-layered structure and includes an oxide layer (e.g., silicon oxide) and a nitride layer (e.g., silicon nitride) over the oxide layer. In other embodiments, the passivation layer 115 has a single layer structure, e.g., having a single nitride layer. The passivation layer 115 may be formed using, for example, CVD, PVD, ALD, another applicable process, or a combination thereof.

Figure 5:
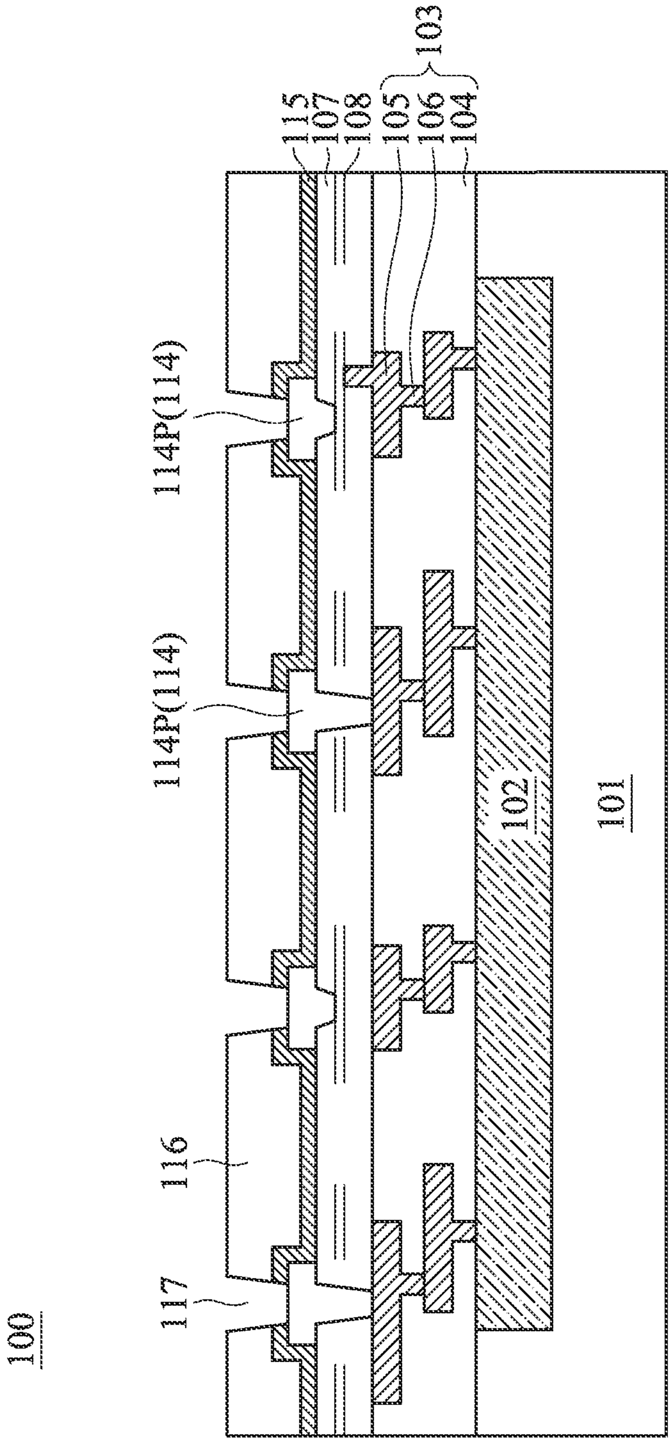

Referring next to FIG. 5, a photoresist layer 116 is formed over the passivation layer 115 by, e.g., spin coating. The photoresist layer 116 is then patterned by, e.g., photolithography techniques to form openings 117 at locations where second conductive/redistribution vias will be formed. Next, an etching process is performed to remove portions of the passivation layer 115 (i.e., patterning the passivation layer 115) exposed by the openings 117. It should be understood that openings (i.e., the removed portions) of patterned passivation layer 115 are located directly under the openings 117 of the photoresist layer 116, so they may also be referred to as openings 117 after the photoresist layer 116 is removed in a subsequent process (not shown). In some embodiments, the etching process is a dry etch process (e.g., a plasma etching process) using a process gas comprising a mixture of $CF_4$, $CHF_3$, $N_2$, and Ar. Other process gas may also be used.

After the etching process, all conductive pads 114P are exposed through the openings 117. Sidewalls of each of the openings 117 may be perpendicular to or inclined to the upper surface of the photoresist layer 116. The respective process of forming and patterning the second passivation layer 115 is illustrated as process 1004 in the process flow 1000 as shown in FIG. 13.

Figure 6:
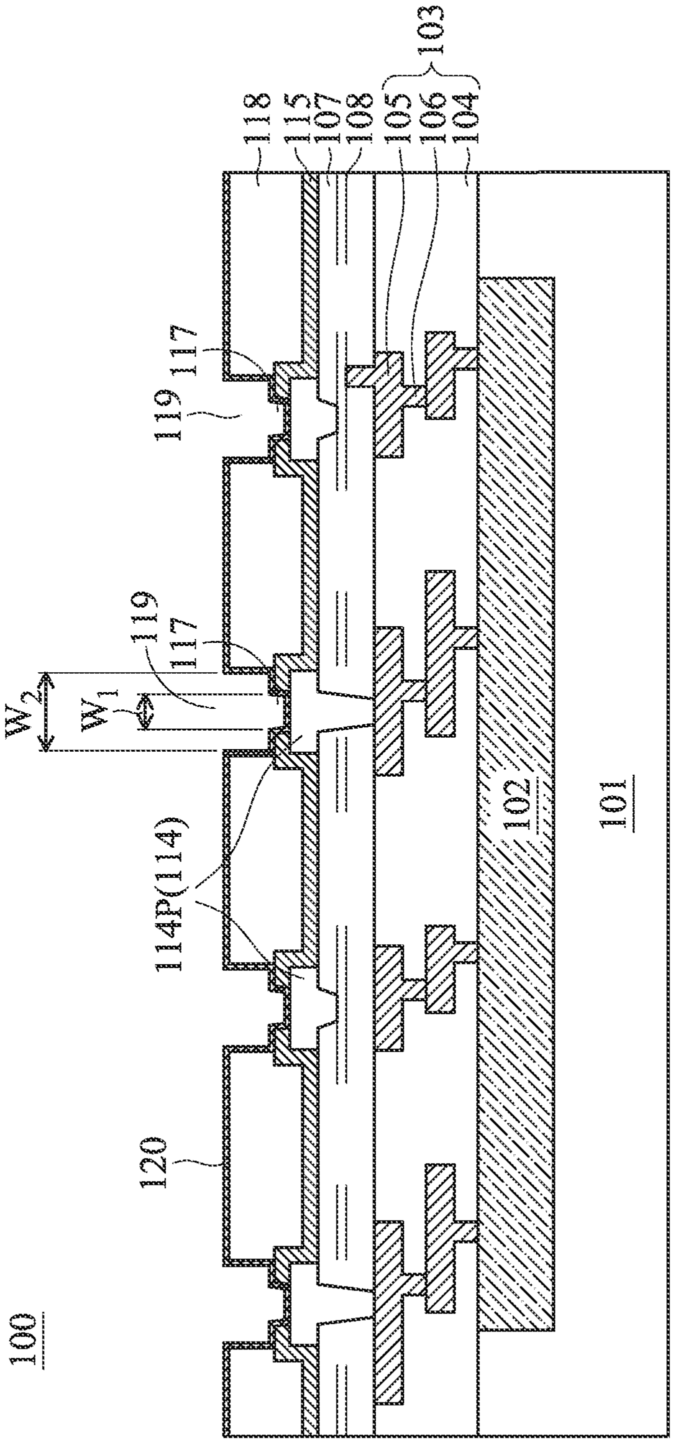

Referring next to FIG. 6, a photoresist layer 118 is formed over the passivation layer 115 and over the conductive pads 114P by, e.g., spin coating, after the photoresist layer 116 (see FIG. 5) is removed. The photoresist layer 118 is then patterned by, e.g., photolithography techniques to form openings 119 at locations where a second RDL layer will be formed. In some embodiments, the openings 119 of the patterned photoresist layer 118 correspond to the underlying openings 117 of the patterned passivation layer 115, and the width W2 of each of the openings 119 is generally greater than the width $W_1$ of the respective opening 117.

After the openings 119 are formed, a barrier layer 120 is formed conformally over the upper surface of the photoresist layer 118 and along sidewalls and bottoms of the openings 117 and 119. The material, structure and formation method of the barrier layer 120 may be the same or similar to those of the barrier layer 112 illustrated in FIG. 2, and are not repeated here.

Figure 7:
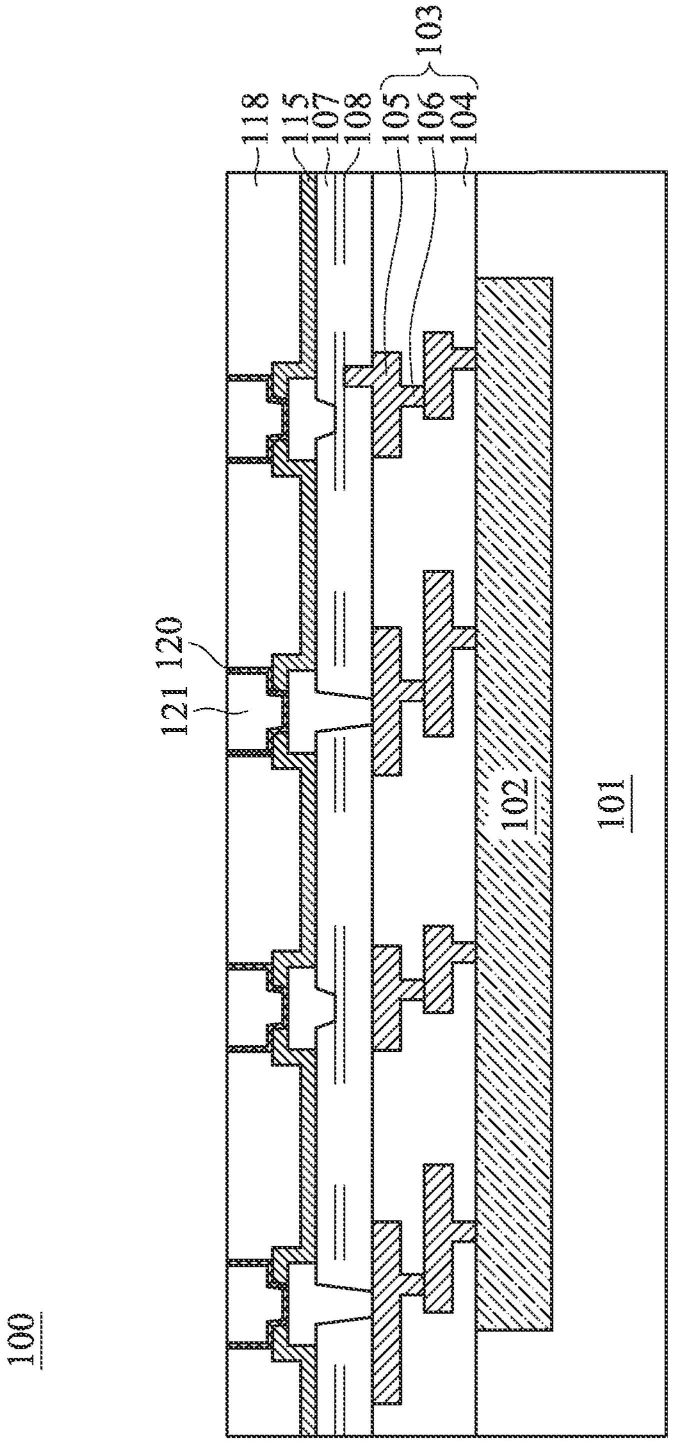

Referring next to FIG. 7, a conductive (or metal) material 121 (e.g., copper) is deposited over the barrier layer 120, e.g., by electrochemical plating (ECP). The conductive material 121 fills the remaining portions of the openings 117 and 119. The conductive material 121 further includes some portions over the upper surface of the photoresist layer 118. Next, a planarization process such as a chemical mechanical polish (CMP) process is performed to remove excess portions of the conductive material 121 and the barrier layer 120, until the photoresist layer 118 is exposed. Afterwards, the photoresist layer 118 is removed by a suitable removal process, such as ashing.

Figure 8A:
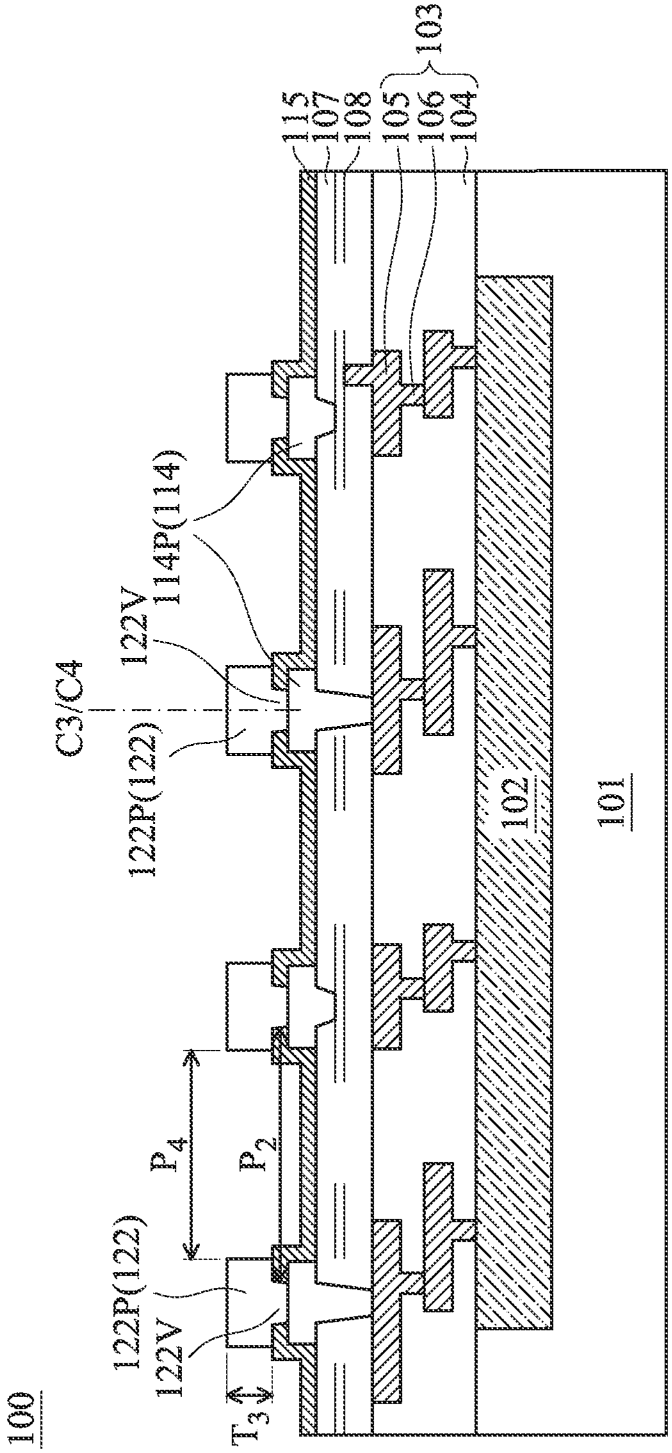

As a result, portions of the conductive material 121 remaining over the passivation layer 115 form conductive pads 122P, and portions of the conductive material 121 that fill (i.e., extending into) the openings 117 (see FIG. 6) in the passivation layer 115 form conductive vias 122V, where the conductive vias 122V electrically couple the conductive pads 122P to the underlying conductive pads 114P of the first RDL layer 114, as shown in FIG. 8A. Note that in the discussion herein, the barrier layer 120 (see FIG. 7) in the openings 117 is considered part of the conductive vias 122V, and the barrier layer 120 over the upper surface of the passivation layer 115 is considered part of the conductive pads 122P. Although not shown in FIG. 8A, conductive lines (e.g., copper lines) may also be formed over the upper surface of the passivation layer 115 during the same processing steps to form the conductive pads 122P. The conductive pads 122P (which may also be referred to as second pads) and the conductive lines may be collectively referred to as a redistribution layer (RDL) 122 (which may also be referred to as second RDL layer), and the conductive vias 122V may be referred to as (second) redistribution vias 122V. The respective process of forming the second RDL layer 122 and the second redistribution vias 122V is illustrated as process 1005 in the process flow 1000 as shown in FIG. 13.

In the example of FIG. 8A, the thickness $T_3$ of the second RDL layer 122 is greater than the thickness $T_1$ (see FIG. 3A) of the first RDL layer 114 For example, the thickness $T_3$ of the second RDL layer 122 may be in the range between about 20 kÅ to about 80 kÅ (e.g., about 55 kÅ), but the present disclosure is not limited thereto. The shape of the cross-section of the conductive pad 122P may be a dome shape (e.g., with a curved upper surface), a concave shape, a polygon shape, or a rectangular (or square) shape, similar to the conductive pads 114P.

Figure 8B:
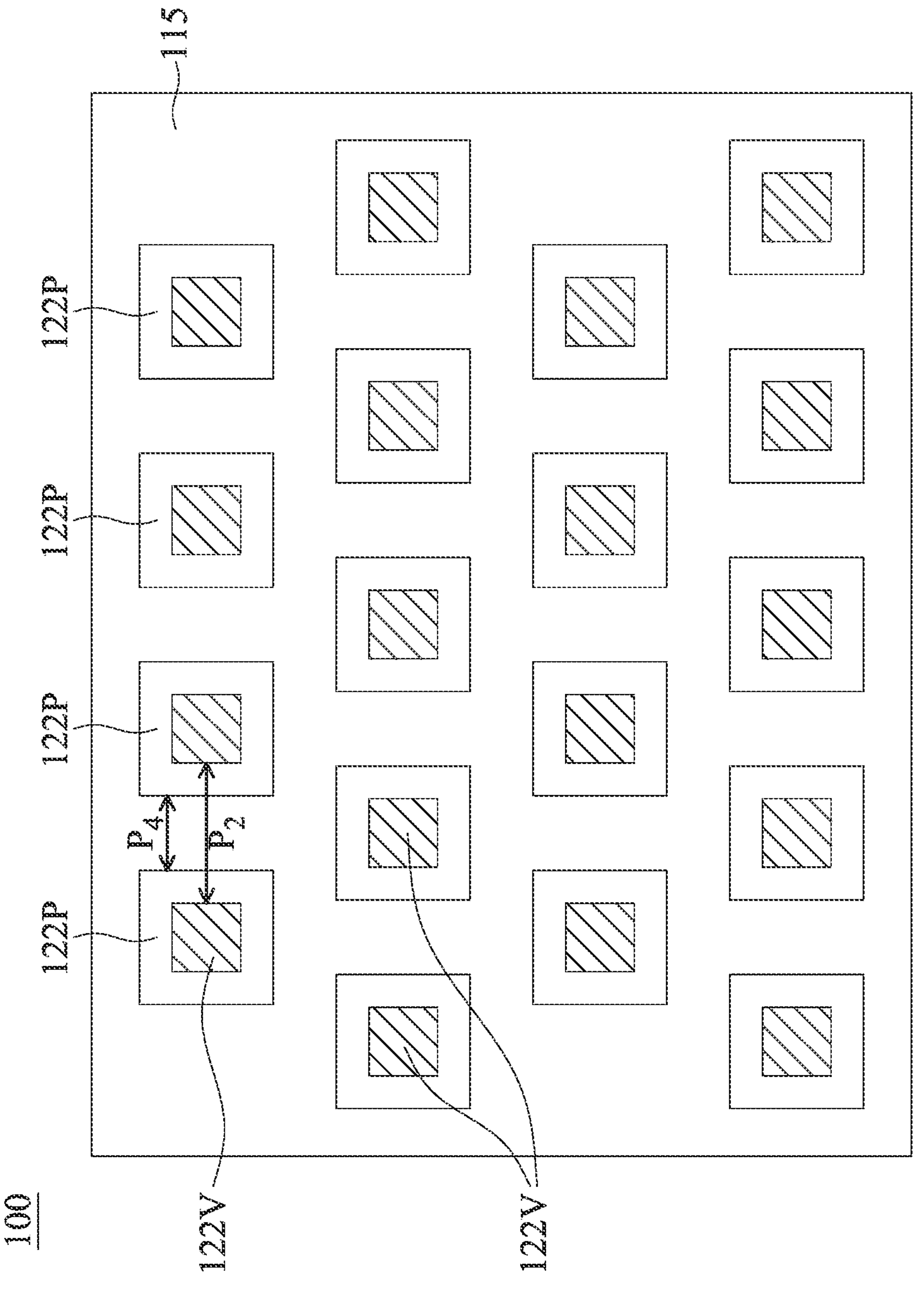

FIG. 8B is a schematic plan view showing the arrangement of the conductive pads 122P of the second RDL layer 122 and the conductive vias 122V in FIG. 8A (where conductive lines of the second RDL layer 122 interconnecting the conductive pads 122P are not shown for simplicity). The arrangement/position of the conductive pads 122P and the conductive vias 122V is the same as (i.e., corresponding to) the arrangement/position of the conductive pads 114P of the first RDL layer 114 and the conductive vias 114V illustrated in FIG. 3B, but the present disclosure is not limited thereto. Other arrangements of the conductive pads 122P and the conductive vias 122V may also be used, such as different arrangements than those of conductive pads 114P and the conductive vias 114V. Each of the conductive pads 122P and conductive vias 122V in FIG. 8B is illustrated to have a square shape as a non-limiting example. Other shapes, such as circle shape, oval shape, rectangular shape, other polygon shape, or the like, are also possible and are fully intended to be included within the scope of the current disclosure.

In some embodiments, the center (line) C3 of each of the conductive pads 122P is aligned with the center (line) C4 of the respective conductive via 122V, as shown in FIG. 8A, but the center line C3 of each conductive pad 122P may also be laterally offset from the center line C4 of the respective conductive via 122V in other embodiments.

In the example of FIGS. 8A and 8B, the (minimum) space $P_2$ between adjacent conductive vias 122V may be in the range between about 6 μm to 8 μm (e.g., about 6 μm), and/or the (minimum) space $P_4$ between adjacent conductive pads 122P may be in the range between about 4 μm to 7 μm (e.g., about 4 μm), but the present disclosure is not limited thereto.

Figure 9:
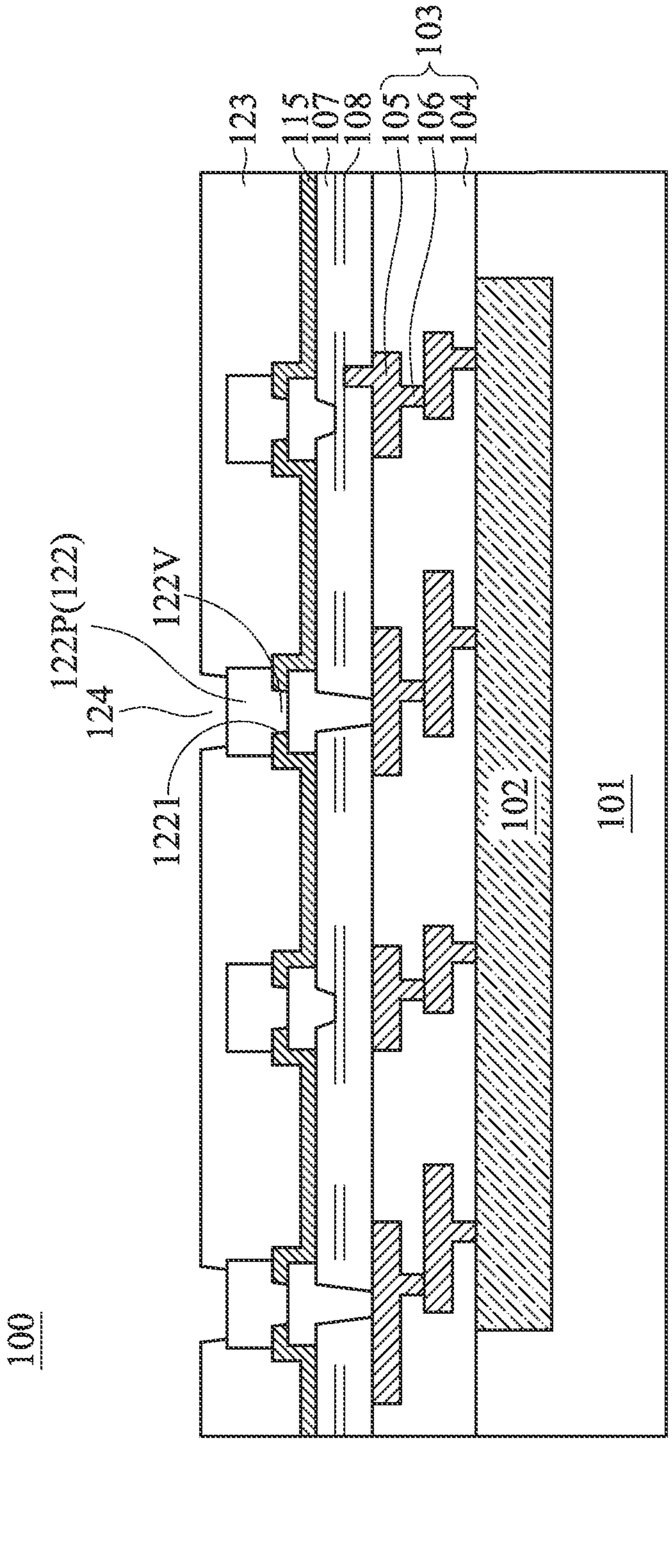

Referring next to FIG. 9, a dielectric layer 123 is formed over the second RDL layer 122, over the passivation layer 115, and over the passivation layer 107. Openings 124 (which may also be referred to as second via openings) are then formed (e.g., e.g., using photolithography and etching techniques) in the dielectric layer 123 to expose some of the conductive pads 122P of the second RDL layer 122. The dielectric layer 123 may be formed of, e.g., polymer, polyimide (PI), benzocyclobutene (BCB), or the like. The dielectric layer 123 is illustrated as a single layer in FIG. 9 as a non-limiting example. The dielectric layer 123 may also have a multi-layer structure that includes a plurality of sub-layers formed of different dielectric materials. The respective process of forming and patterning the dielectric layer 123 is illustrated as process 1007 in the process flow 1000 as shown in FIG. 13.

In some embodiment, sidewalls 1221 of the second redistribution vias 122V are laterally surrounded by and in contact with the second passivation layer 115, and are separated from the dielectric layer 123 by the second passivation layer 115.

Figure 10A:
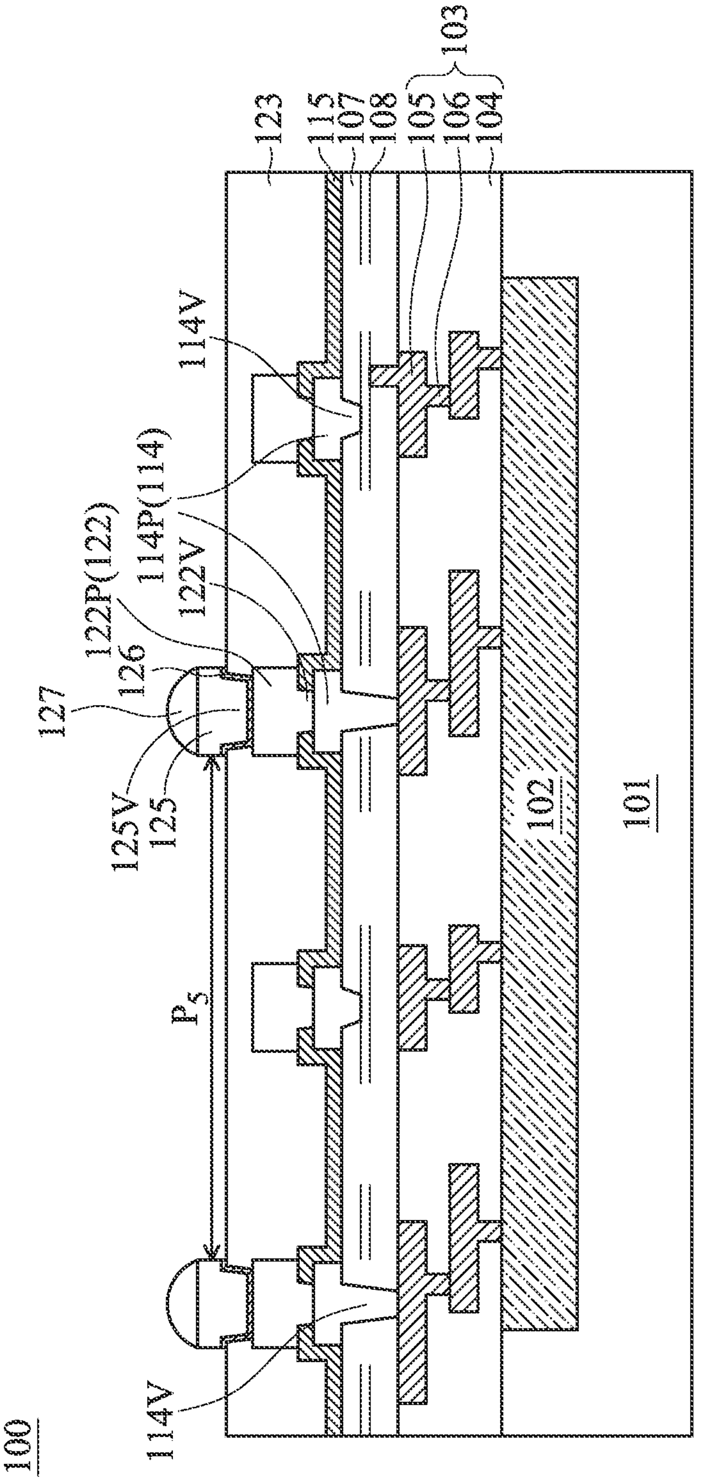

Referring next to FIG. 10A, conductive bumps (e.g., micro-bumps or C4 bumps) 125 are formed on the conductive pads 122P exposed through the openings 124 (see FIG. 9), and solder regions 127 (e.g., solder material) are formed on the conductive bumps 125. The respective process is illustrated as process 1008 in the process flow 1000 as shown in FIG. 13. The conductive bumps 125 and the solder regions 127 are configured to provide power and ground signals to devices or components in the semiconductor device 100 and provide electrical connection between the semiconductor device 100 and an external circuitry (not shown). The formation of the conductive bumps 125 may include forming a seed layer 126 over the dielectric layer 123 and along sidewalls and bottoms of the openings 124 (see FIG. 9); forming a patterned photoresist layer (not shown) over the seed layer 126, where openings of the patterned photoresist layer are formed at locations where the conductive bumps 125 are to be formed; forming (e.g., plating) an electrically conductive material (e.g., copper) over the seed layer 126 in the openings; removing the patterned photoresist layer; and then removing portions of the seed layer 126 over which no conductive bump 125 is formed.

As a result, portions of the electrically conductive material that fill (i.e., extending into) the openings 124 form conductive bump vias 125V that electrically couple the conductive bumps 125 to underlying exposed conductive pads 122P. Note that in the discussion herein, the seed layer 126 in the openings 124 is considered part of the conductive bump vias 125V, and the seed layer 126 over the upper surface of the dielectric layer 123 is considered part of the conductive bump 125.

Figure 10B:
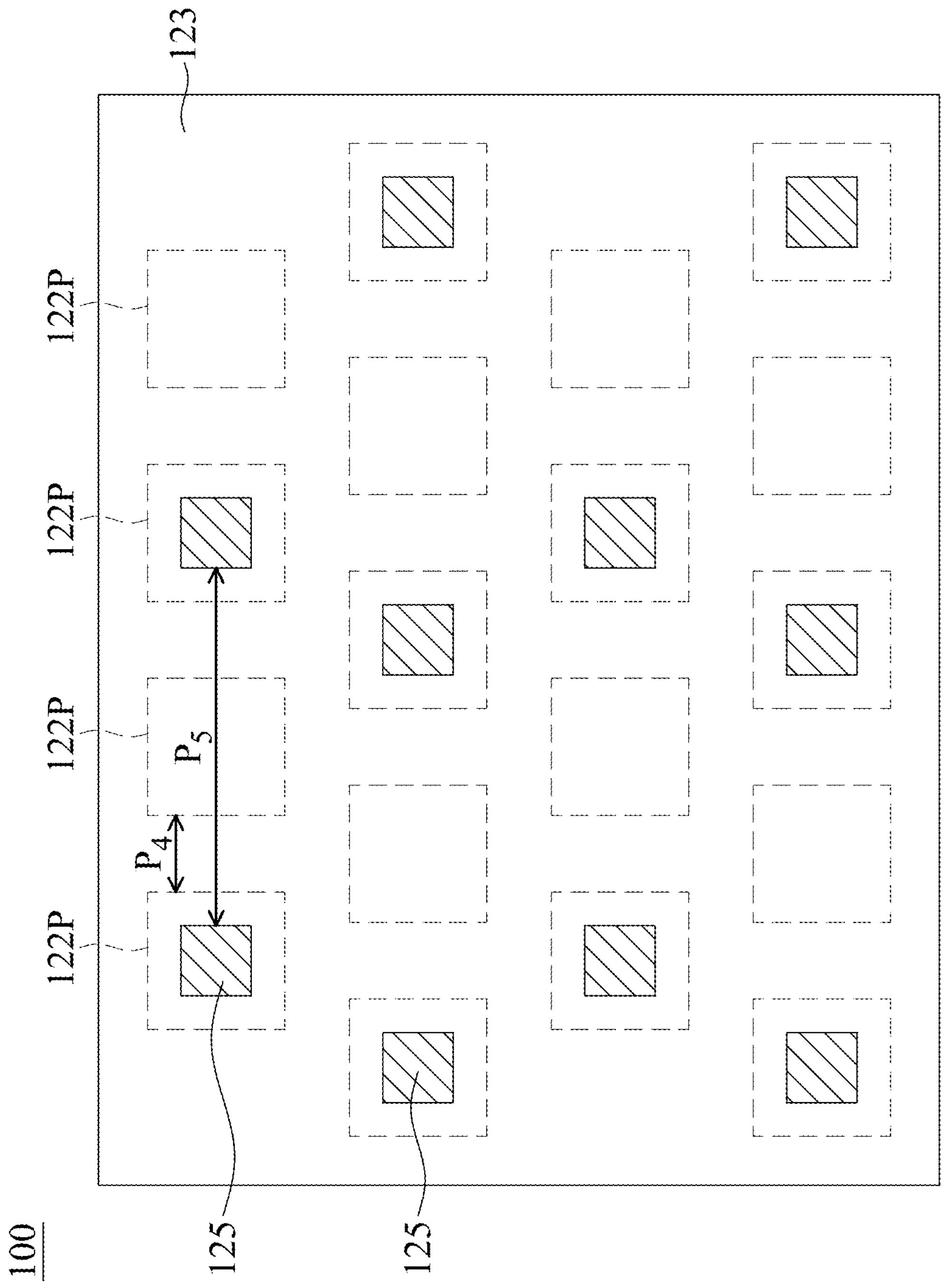

FIG. 10B is a schematic plan view showing the arrangement of the conductive bumps 125 (where solder regions 127 are not shown for simplicity). As shown in FIG. the conductive bumps 125 may be arranged in multiple rows and columns over the dielectric layer 123, and may correspond to some of the underlying conductive pads 122P (depicted in dashed lines) of the second RDL layer 122. Therefore, the number of conductive bumps 125 is less than the number of conductive pads 122P (which is equal to the number of conductive pads 114P of the first RDL layer 114). Each of the conductive bumps 125 in FIG. 10B is illustrated to have a square shape as a non-limiting example. Other shapes, such as circle shape, oval shape, rectangular shape, other polygon shape, or the like, are also possible and are fully intended to be included within the scope of the current disclosure.

In the example of FIGS. 10A and 10B, the (minimum) space $P_5$ between adjacent conductive bumps 125 is greater than the (minimum) space $P_4$ between adjacent conductive pads 122P. For example, the (minimum) space $P_5$ between adjacent conductive bumps 125 may be in the range between about 12 μm to 21 μm (e.g., about 12 μm), but the present disclosure is not limited thereto.

In the above-mentioned semiconductor device embodiments, a bilayer RDL structure is provided, which includes the first RDL layer 114 and the second RDL layer 122 over the first RDL layer 114. The first RDL layer 114 and the associated (first) redistribution vias 114V are configured to electrically couple underlying devices or components (e.g., the MIM capacitors 108 and underlying circuits and/or electrical components 102) and the second RDL layer 122 above. The second RDL layer 122 and the associated (second) redistribution vias 122V are configured to provide routing of power and ground signals (from the conductive bumps 125) to devices or components in the semiconductor device 100.

By forming the first RDL layer 114 with an aluminum-copper (Al—Cu) alloy material and the second RDL layer 122 with a copper (Cu) material as mentioned above, the second RDL layer 122 can have a smaller surface/sheet resistance than the first RDL layer 114. For example, the sheet resistance of the second RDL layer 122 made of Cu (about 55 kÅ thick) is about 0.0033 ohm/sq (ohms per square), and the sheet resistance of the first RDL layer 114 made of Al—Cu alloy (about 28 kÅ thick) is about 0.0110, as examples. This helps the second RDL layer 122 to be more suitable (compared to the first RDL layer 144) for routing of power and grounds due to lower IR drop, and can help further reduce the number of power and ground bumps (e.g., the number of conductive bumps 125 can be reduced to be less than number of conductive pads 122P of the second RDL layer 122, as discussed above). As a result, the bump area (and thus the device area) of the semiconductor device 100 can also be reduced accordingly, contributing to device size reduction in advanced technology applications.

In addition, the use of Al—Cu alloy material to form the first RDL layer 114 is to enable the MIM capacitors 108 to operate at high frequencies. As can be known by those skilled in the art, the process for forming Al—Cu RDL typically has a smaller (redistribution) via space/pitch than the process for forming Cu RDL (e.g., minimum via-to-via space: 5 μm for Al—Cu RDL; 6.9 μm for Cu RDL), so the first RDL layer 114 made of Al—Cu alloy helps to achieve better RC delay performance when the MIM capacitors operate at high frequencies (e.g., about 2.8 GHz).

Therefore, the advantages of reduced conductive bump count/device size and high frequency applications of MIM capacitors can be achieved at the same time by using the bilayer RDL structure of this embodiment. The same advantages cannot be obtained using a single RDL structure with Cu or Al—Cu alloy material.

It should be understood that the geometries, configurations, materials and the manufacturing methods described herein are only illustrative, and are not intended to be, and should not be constructed to be, limiting to the present disclosure. Many alternatives and modifications will be apparent to those skilled in the art, once informed by the present disclosure. For example, one skilled in the art will appreciate that the materials for the first RDL layer (and its associated vias) and second RDL layer (and its associated vias) are not limited to AlCu alloy and Cu materials, respectively. In other embodiments, the first RDL layer (and its associated vias) may comprise a first (metal) material (other than AlCu alloy) and the second RDL layer (and its associated vias) may comprise a second (metal) material (other than Cu), as long as the sheet resistance of the second material is lower than the sheet resistance of the first material.

Figure 11:
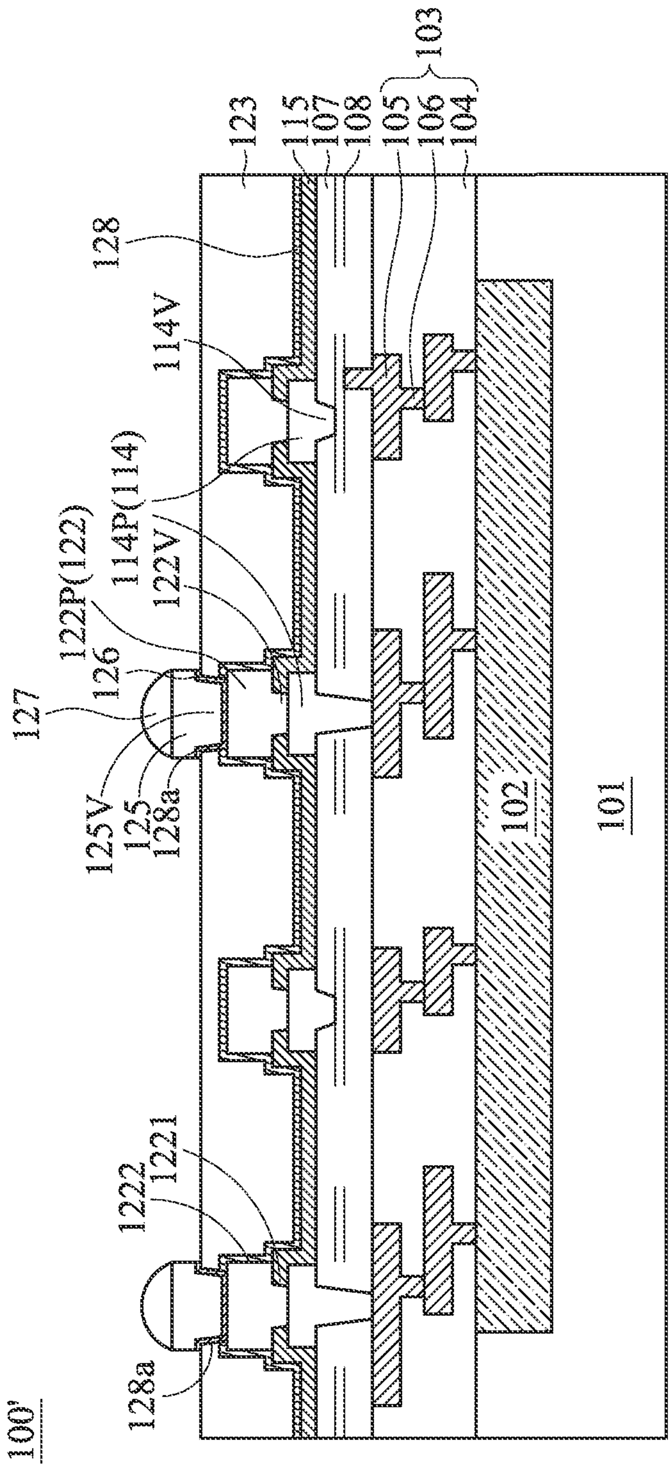
FIG. 11 illustrates a cross-sectional view of a semiconductor device with MIM capacitors in accordance with some embodiments.

FIG. 11 illustrates a cross-sectional view of a modified semiconductor device 100' in accordance with some other embodiments. The semiconductor device 100' differs from the above-described semiconductor device 100 only in that a passivation layer 128 (which may also be referred to as third passivation layer) is further provided. In the example of FIG. 11, the third passivation layer 128 is conformally over the second RDL layer 122 and the second passivation layer 115 and located below the dielectric layer 123. The formation of the third passivation layer 128 precedes the formation of dielectric layer 123 (the respective process is illustrated as process 1001 in the process flow 1006 as shown in FIG. 13). The structure and material(s) of passivation layer 128 may be the same as or similar to those of passivation layer 115 illustrated in FIG. 4, and they are not repeated here. The third passivation layer 128 helps to block moisture and avoid oxidation of the second pad 122P.

In some embodiments, the third passivation layer 128 is formed along the sidewalls and tops of each conductive pads 122P of the second RDL layer 122, except for the portions of the top surfaces of some conductive pads 122P in contact with the conductive bumps 125. More specifically, the third passivation layer 128 is in contact with sidewalls 1222 of each of the second pads 122P, so that sidewalls 1222 of each second pad 122P are separated from (e.g., not contacting) the dielectric layer 123 by the third passivation layer 128. Also, the third passivation layer 128 extends over top surfaces of each second pad 122P, and has some via openings 128*a* (which may also be referred to as third via openings) corresponding to (e.g., located directly below the second via openings 124, see FIG. 9, so the via openings 128*a* may also be referred to as second via openings 124) and exposing the second pad 122P in contact with the conductive bumps 125. The third passivation layer 128 may laterally surround the conductive bumps 125.

Figure 12:
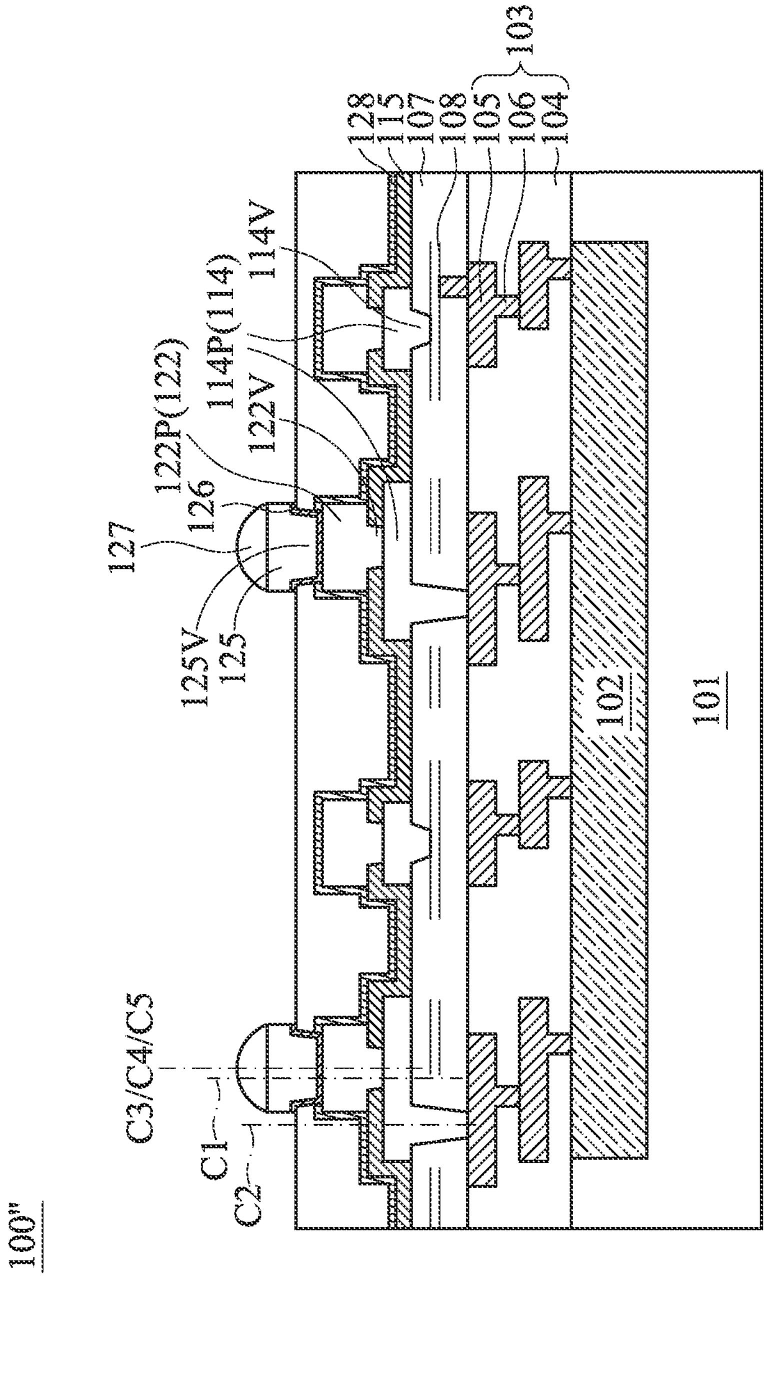
FIG. 12 illustrates a cross-sectional view of a semiconductor device with MIM capacitors in accordance with some embodiments.

FIG. 12 illustrates a cross-sectional view of a modified semiconductor device 100" in accordance with some other embodiments. The semiconductor device 100" differs from the above-described semiconductor device 100' (in FIG. 11) only in that the center (line) C1 of some conductive pads 114P is laterally offset from the center line C2 of the respective conductive via 114V, so that the conductive pad 114P has a relatively large area that is over (and that extends onto) the upper surface of the passivation layer 107. This can improve the flatness of the upper surface of the conductive pads 114P, thereby facilitating the landing of the conductive vias 122V. In addition, in the example of FIG. 12, the center (line) C4 of conductive vias 122V, the center (line) C3 of the conductive pads 122P and the center (line) C5 of the conductive bumps 125 are substantially aligned with each other, and are arranged opposite to the center (line) C2 of the conductive vias 114V relative to the center (line) C1 of the conductive pads 114P, but the present disclosure is not limited thereto. The center (lines) C3, C4 and C5 of the conductive pads 122P, conductive vias 122V and conductive bumps 125 may be aligned with the center (line) C1 of the respective conductive pad 114P in other embodiments.

The embodiments of the present disclosure have some advantageous features. By providing or forming a bilayer RDL structure over a passivation layer embedding MIM capacitors, where the upper RDL layer has a lower sheet resistance than the lower RDL layer, and the redistribution vias associated to the lower RDL layer have a smaller via pitch than the redistribution vias associated to the upper RDL layer, the benefits of reduced conductive bump count/device size and high frequency applications of MIM capacitors can be achieved simultaneously.

In accordance with some embodiments, a method of forming a semiconductor device is provided. The method includes: forming an interconnect structure over a substrate; forming a first passivation layer over the interconnect structure, and a metal-insulator-metal capacitor in the first passivation layer; forming a first redistribution layer including a plurality of first pads over the first passivation layer, and a plurality of first redistribution vias extending into the first passivation layer; conformally forming a second passivation layer over the first redistribution layer and the first passivation layer, and patterning the second passivation layer to form a plurality of first via openings exposing the first pads; forming a second redistribution layer including a plurality of second pads over the second passivation layer, and a plurality of second redistribution vias in the first via openings to contact the first pads, wherein the first redistribution layer and the first redistribution vias comprise aluminum-copper alloy, and the second redistribution layer and the second redistribution vias comprise copper; forming a dielectric layer over the second redistribution layer and the second passivation layer, and patterning the dielectric layer to form a plurality of second via openings exposing a part of the second pads; and forming a plurality of conductive bumps over the dielectric layer and in the second via openings to contact the part of the second pads.

In accordance with some embodiments, a method of forming a semiconductor device is provided. The method includes: forming an interconnect structure over a substrate and electrically coupled to an electrical component formed in or on the substrate; forming a first passivation layer over the interconnect structure, and a metal-insulator-metal capacitor in the first passivation layer; forming a first redistribution layer including a plurality of first pads over the first passivation layer, and a plurality of first redistribution vias extending into the first passivation layer; conformally forming a second passivation layer over the first redistribution layer and the first passivation layer, and patterning the second passivation layer to form a plurality of first via openings exposing the first pads; forming a second redistribution layer including a plurality of second pads over the second passivation layer, and a plurality of second redistribution vias in the first via openings to contact the first pads, wherein the first redistribution layer and the first redistribution vias comprise a first material, the second redistribution layer and the second redistribution vias comprise a second material, and the second material has a lower sheet resistance than that of the first material; forming a dielectric layer over the second redistribution layer and the second passivation layer, and patterning the dielectric layer to form a plurality of second via openings exposing a part of the second pads; and forming a plurality of conductive bumps over the dielectric layer and in the second via openings to contact the part of the second pads.

In accordance with some embodiments, a semiconductor device is provided. The semiconductor device includes: an electrical component in or on a substrate; an interconnect structure over the substrate and electrically coupled to the electrical component; a first passivation layer over the interconnect structure, and a metal-insulator-metal capacitor in the first passivation layer; a first redistribution layer including a plurality of first pads over the first passivation layer, and a plurality of first redistribution vias extending into the first passivation layer; a second passivation layer conformally over the first redistribution layer and the first passivation layer and having a plurality of first via openings exposing the first pads; a second redistribution layer including a plurality of second pads over the second passivation layer, and a plurality of second redistribution vias in the first via openings to contact the first pads, wherein the first redistribution layer and the first redistribution vias comprise a first material, the second redistribution layer and the second redistribution vias comprise a second material, and the second material has a lower sheet resistance than that of the first material; a dielectric layer over the second redistribution layer and the second passivation layer and having a plurality of second via openings exposing a part of the second pads, wherein the sidewalls of the second redistribution vias are in contact with the second passivation layer and separated from the dielectric layer by the second passivation layer; and a plurality of conductive bumps over the dielectric layer and in the second via openings to contact the part of the second pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:

forming an interconnect structure over a substrate;

forming a first passivation layer over the interconnect structure, and a metal-insulator-metal (MIM) capacitor in the first passivation layer;

forming a first redistribution layer including a plurality of first pads over the first passivation layer, and a plurality of first redistribution vias extending into the first passivation layer;

conformally forming a second passivation layer over the first redistribution layer and the first passivation layer, and patterning the second passivation layer to form a plurality of first via openings exposing the first pads;

forming a second redistribution layer including a plurality of second pads over the second passivation layer, and a plurality of second redistribution vias in the first via openings to contact the first pads, wherein the second pads are electrically connected to the first pads through the second redistribution vias, wherein the first redistribution layer and the first redistribution vias comprise aluminum-copper alloy and the second redistribution layer and the second redistribution vias comprise copper, wherein the second redistribution layer and the second redistribution vias have a lower sheet resistance than that of the first redistribution layer and the first redistribution vias;

forming a dielectric layer over the second redistribution layer and the second passivation layer, and patterning the dielectric layer to form a plurality of second via openings exposing some of the plurality of second pads; and forming a plurality of conductive bumps over the dielectric layer and in the second via openings to contact the some of the plurality of second pads but not all of the plurality of second pads.

2. The method as claimed in claim 1, wherein the second redistribution layer and the second redistribution vias are formed in a same electrochemical plating (ECP) process.

3. The method as claimed in claim 1, wherein sidewalls of the second redistribution vias are separated from the dielectric layer by the second passivation layer.

4. The method as claimed in claim 1, further comprising:

conformally forming a third passivation layer over the second redistribution layer and the second passivation layer before forming the dielectric layer, wherein a portion of the third passivation layer located over top surfaces of the second pads and a portion of the third passivation layer located along sidewalls of the second pads have substantially the same thickness, wherein the formed dielectric layer is located over the second redistribution layer, the second passivation layer and the third passivation layer, and wherein the second via openings are formed through the dielectric layer and the third passivation layer to expose the some of the plurality of second pads.

5. The method as claimed in claim 4, wherein:

the sidewalls of the second pads are separated from the dielectric layer by the third passivation layer, and the third passivation layer further covers a portion of the top surface of each of the some of the plurality of second pads and laterally surrounds the respective conductive bump.

6. The method as claimed in claim 1, wherein a space between adjacent conductive bumps of the plurality of conductive bumps is greater than a space between adjacent second pads of the plurality of second pads.

7. The method as claimed in claim 6, wherein a number of the second pads is equal to a number of the first pads and greater than a number of the conductive bumps.

8. The method as claimed in claim 1, further comprising:

forming an electrical component on or in the substrate, wherein the interconnect structure is electrically coupled to the electrical component.

9. A method of forming a semiconductor device, the method comprising:

forming an interconnect structure over a substrate and electrically coupled to an electrical component formed in or on the substrate;

forming a first passivation layer over the interconnect structure, and a metal-insulator-metal (MIM) capacitor in the first passivation layer;

forming a first redistribution layer including a plurality of first pads over the first passivation layer, and a plurality of first redistribution vias extending into the first passivation layer;

conformally forming a second passivation layer over the first redistribution layer and the first passivation layer, and patterning the second passivation layer to form a plurality of first via openings exposing the first pads;

forming a second redistribution layer including a plurality of second pads over the second passivation layer, and a plurality of second redistribution vias in the first via openings to contact the first pads, wherein the second pads are electrically connected to the first pads through the second redistribution vias, wherein the first redistribution layer and the first redistribution vias comprise a first material, the second redistribution layer and the second redistribution vias comprise a second material, and the second material has a lower sheet resistance than that of the first material;

forming a dielectric layer over the second redistribution layer and the second passivation layer, and patterning the dielectric layer to form a plurality of second via openings exposing some of the plurality of second pads; and forming a plurality of conductive bumps over the dielectric layer and in the second via openings to contact the some of the plurality of second pads but not all of the plurality of second pads.

10. The method as claimed in claim 9, wherein a thickness of the second redistribution layer is greater than a thickness of the first redistribution layer.

11. The method as claimed in claim 9, wherein sidewalls of the second redistribution vias are in contact with the second passivation layer and separated from the dielectric layer by the second passivation layer, and the second passivation layer is a multi-layered structure and includes an oxide layer and a nitride layer over the oxide layer.

12. The method as claimed in claim 11, further comprising:

conformally forming a third passivation layer over the second redistribution layer and the second passivation layer before forming the dielectric layer, wherein a portion of the third passivation layer located over top surfaces of the second pads and a portion of the third passivation layer located along sidewalls of the second pads have substantially the same thickness, wherein the formed dielectric layer is located over the third passivation layer on the second redistribution layer and the second passivation layer, and wherein the second via openings are formed through the dielectric layer and the third passivation layer to expose the some of the plurality of second pads.

13. The method as claimed in claim 12, wherein:

the sidewalls of the second pads are in contact with the third passivation layer and separated from the dielectric layer by the third passivation layer, the third passivation layer further covers a portion of the top surface of each of the some of the plurality of second pads and laterally surrounds the respective conductive bump, and the third passivation layer is a nitride layer.

14. The method as claimed in claim 9, wherein a space between adjacent conductive bumps of the plurality of conductive bumps is greater than a space between adjacent second pads of the plurality of second pads.

15. The method as claimed in claim 14, wherein a number of the second pads is equal to a number of the first pads and greater than a number of the conductive bumps.

16. A method of forming a semiconductor device, the method comprising:

forming an interconnect structure over a substrate;

forming a first passivation layer over the interconnect structure, and a metal-insulator-metal (MIM) capacitor in the first passivation layer;

forming a first redistribution layer including a plurality of first pads over the first passivation layer, and a plurality of first redistribution vias extending into the first passivation layer;

conformally forming a second passivation layer over the first redistribution layer and the first passivation layer, and patterning the second passivation layer to form a plurality of first via openings exposing the first pads;

forming a second redistribution layer including a plurality of second pads over the second passivation layer, and a plurality of second redistribution vias in the first via openings to contact the first pads, wherein the second pads are electrically connected to the first pads through the second redistribution vias, wherein the first redistribution layer and the first redistribution vias comprise a first material, the second redistribution layer and the second redistribution vias comprise a second material, and the second material has a lower sheet resistance than that of the first material;

forming a dielectric layer over the second redistribution layer and the second passivation layer, and patterning the dielectric layer to form a plurality of second via openings exposing some of the plurality of second pads; and forming a plurality of conductive bumps over the dielectric layer and in the second via openings to contact the some of the plurality of second pads but not all of the plurality of second pads, wherein a number of the second pads is greater than a number of the conductive bumps.

17. The method as claimed in claim 16, wherein a space between adjacent conductive bumps of the plurality of conductive bumps is greater than a space between adjacent second pads of the plurality of second pads.

18. The method as claimed in claim 16, wherein a thickness of the second redistribution layer is greater than a thickness of the first redistribution layer.

19. The method as claimed in claim 16, wherein sidewalls of the second redistribution vias are in contact with the second passivation layer and separated from the dielectric layer by the second passivation layer.

20. The method as claimed in claim 16, wherein a center of at least one of the first pads is offset from a center of the respective first redistribution via.

* * * * *